United States Patent
Friedrich et al.

(10) Patent No.: US 9,606,190 B2
(45) Date of Patent: Mar. 28, 2017

(54) MAGNETIC FIELD SENSOR ARRANGEMENTS AND ASSOCIATED METHODS

(71) Applicants: Andreas P. Friedrich, Metz-Tessy (FR); Nicolas Yoakim, Annecy (FR); Andrea Foletto, Annecy (FR)

(72) Inventors: Andreas P. Friedrich, Metz-Tessy (FR); Nicolas Yoakim, Annecy (FR); Andrea Foletto, Annecy (FR)

(73) Assignee: Allegro Microsystems, LLC, Worcester, MA (US)

( * ) Notice: Subject to any disclaimer, the term of this patent is extended or adjusted under 35 U.S.C. 154(b) by 683 days.

(21) Appl. No.: 13/724,149

(22) Filed: Dec. 21, 2012

(65) Prior Publication Data

US 2014/0176126 A1 Jun. 26, 2014

(51) Int. Cl.
*G01R 33/07* (2006.01)
*G01R 33/02* (2006.01)

(52) U.S. Cl.
CPC .......... *G01R 33/02* (2013.01); *G01R 33/077* (2013.01)

(58) Field of Classification Search
CPC ...... G01R 33/07; G01R 33/02; G01R 33/072; G01R 33/075; G01R 15/202; G01R 25/00; G01R 33/0052; G01R 33/09; G01R 15/207; G01R 19/0092; G01R 33/0029; G01R 33/06; G01R 21/133; G01R 33/0005; G01R 33/0023
USPC ......... 324/207, 251, 244, 76.77, 207.2, 174; 338/32 H
See application file for complete search history.

(56) References Cited

U.S. PATENT DOCUMENTS

| | | |
|---|---|---|
| 4,668,914 A | 5/1987 | Kersten et al. |
| 4,761,569 A | 8/1988 | Higgs |
| 4,814,673 A | 3/1989 | Nguyen |
| 4,829,352 A | 5/1989 | Popovic et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |

(Continued)

FOREIGN PATENT DOCUMENTS

| | | |
|---|---|---|
| DE | 10 2005 014 509 B4 | 10/2006 |
| DE | 10 2006 037 226 A1 | 2/2008 |

(Continued)

OTHER PUBLICATIONS

Drljaca, et al.; "Nonlinear Effects in Magnetic Angular Position Sensor With Integrated Flux Concentrator," Proc. 23$^{rd}$ International Conference on Microelectronics (MIEL 2002); vol. 1; NIS; Yugoslavia; May 12-15, 2002, pp. 223-226.

(Continued)

*Primary Examiner* — Patrick Assouad
*Assistant Examiner* — Taqi Nasir
(74) *Attorney, Agent, or Firm* — Daly, Crowley, Mofford & Durkee, LLP

(57) ABSTRACT

Magnetic field sensor arrangements and methods provide a magnetic field sensor positioned proximate to a magnet with an axis of sensitivity aligned relative to the magnet in orientations that provide a good sensitivity and a mechanical difference from other arrangements.

20 Claims, 13 Drawing Sheets

(56) References Cited

U.S. PATENT DOCUMENTS

| | | | |
|---|---|---|---|
| 5,657,189 A | 8/1997 | Sandhu | |
| 5,694,038 A | 12/1997 | Moody et al. | |
| 5,757,180 A * | 5/1998 | Chou | G01D 5/145 324/207.2 |
| 5,831,513 A | 11/1998 | Lue | |
| 5,844,411 A | 12/1998 | Vogt | |
| 5,942,895 A | 8/1999 | Popovic et al. | |
| 6,064,199 A | 5/2000 | Walter et al. | |
| 6,064,202 A | 5/2000 | Steiner et al. | |
| 6,091,239 A | 7/2000 | Vig et al. | |
| 6,100,680 A | 8/2000 | Vig et al. | |
| 6,154,025 A * | 11/2000 | Schelter | B82Y 25/00 324/174 |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,515,471 B1 * | 2/2003 | Santos | G01D 5/2452 324/207.2 |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,495,432 B2 * | 2/2009 | Kato | G01D 5/245 324/174 |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 2004/0130316 A1 * | 7/2004 | Grueger | G01D 5/145 324/207.2 |
| 2006/0011999 A1 | 1/2006 | Schott et al. | |
| 2008/0054886 A1 * | 3/2008 | Uemura | G01D 5/145 324/207.2 |
| 2009/0121707 A1 | 5/2009 | Schott | |
| 2009/0174395 A1 | 7/2009 | Thomas et al. | |
| 2010/0050731 A1 | 3/2010 | Granig et al. | |
| 2010/0156397 A1 | 6/2010 | Yabusaki et al. | |
| 2010/0164491 A1 | 7/2010 | Kejik et al. | |
| 2011/0025311 A1 * | 2/2011 | Chauvin | G01D 5/145 324/207.25 |
| 2011/0248708 A1 | 10/2011 | Thomas et al. | |
| 2012/0068694 A1 | 3/2012 | Mitamura et al. | |
| 2012/0217955 A1 | 8/2012 | Petrie | |
| 2012/0262155 A1 * | 10/2012 | Donovan | G01R 33/0029 324/207.2 |
| 2012/0299588 A1 * | 11/2012 | Petrie | G01R 33/077 324/251 |
| 2013/0265041 A1 * | 10/2013 | Friedrich | G01R 15/207 324/260 |

FOREIGN PATENT DOCUMENTS

| | | |
|---|---|---|
| DE | 10 2007 036 984 | 1/2009 |
| DE | 10 2007 036 984 A1 | 1/2009 |
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |
| WO | WO 2012/161912 A2 | 11/2012 |
| WO | WO 2014/099280 A3 | 6/2014 |

OTHER PUBLICATIONS

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361, and A1362 Data Sheet: Low-Noise Programmable Linear Hall Effect Sensors, with Adjustable Bandwidth (50 kHz Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position measurements;" Sensors and Actuators, A 67; May 1998; pp. 72-76.

Dwyer; Allegro Microsystems, Inc.; "AN296061 Data Sheet: Ring Magnet Speed Sensing for Electronic Power Steering;" published Jul. 21, 2009; pp. 1-4.

(56) References Cited

OTHER PUBLICATIONS

Freitas at at; "Giant magnetoresistive sensors for rotational speed control;" Jorunal of Applied Physics, vol. 85, No, 8; Apr. 15, 1999; pp. 5459-5461.
Gilbert; "Technical Advances in Hall-Effect Sensing;" Allegro Microsystems, Inc. Product Description; May 10, 2008; 7 sheets.
Häberli et al.; "Contactiess Angle Measurements by CMOS Magnetic Sensor with on Chip Read-Out Circuit;" The 8th International Conference on Solid-State Sensors and Actuators and Eurosensors IX; Jan. 25-29, 1995; pp. 134-137.
Häberli et al; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.
Kejik at at; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al.; "Multitum and high precision through-shaft magnetic sensors;" Sensor + Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
Novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D veritcal Hall magnetic-field sensor using active carrier confinement and post-process micromachining;" The 8th International Conference on Solid-State Sensors and Actuators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement System;" International Electron Devices Meeting; Dec. 8-11, 1996; pp. 533-536.
Sensima technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" http://www.diegm.uniud.it/petrella/Azionamenti %20Elettrici%2011/Sensori%20e%20trasduttori/Data%20Sheet %20-%202SA-10.pdf; pp. 1-7.
van der Meer; et al; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.
Melexis MLX 90324; ""Under-the-Hood" Triaxis Rotary Poeltion feat. SENT Protocol;" 3901090324 Data Sheet; Dec. 2008; 40 pages.
PCT Invitation to Pay Additional Fees with Partial Search Report of the ISA dated Mar. 24, 2014; PCT Pat. App. No. PCT/US2013/ 017619; 7 pages.
PCT Search Report and Written Opinion of the ISA dated Mar. 27, 2014; for PCT Pat. App. No. PCT/US2013/073226; 12 pages.
Banjevic: "High Bandwidth CMOS Magnetic Sensors Based on the Miniaturized Circular Vertical Hall Device;" Sep. 2011; 153 pages.
PCT Search Report of the ISA for PCT/US2013/071619 dated Jul. 25, 2014.
PCT Written Opinion of the ISA for PCT/US2013/071619 dated Jul. 25, 2014.
PCT International Preliminery Report on Patentability of the ISA dated Jul. 2, 2015; for PCT Pat. App. No. PCT/US2013/071619; 15 pages.
PCT International Preiiminary Report on Patentability and Written Opinion of the ISA dated Jul. 2, 2015; for PCT Pat. App. No. PCT/US2013/073226; 10 pages.
Allegro Microsystems, Inc.; "High Precision Linear Hall Effect Sensor IC with a Push/Pull, Pulse Width Modulated Output;" A1351; pp. 1-23.
Allegro Microsystems, Inc.; "High Precision 2-Wire Linear Hall Effect Sensor IC with a Pulse Width Modulated Output;" A1354; pp. 1-22.
Allegro Microsystems, Inc.; "High Precision Linear Hall Effect Sensor with an Open Drain Pulse Width Modulated Output;" A1356; pp. 1-20.
Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.
Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-271.
Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.
Kejik, et al.; "Ultra Low-Power Angular Position Sensor for High-Speed Portable Applications;" 2009 IEEE Sensors Conference; Oct. 25-28, 2009; pp. 173-176.
Raymond, et al.; "True 2D CMOS Integrated Hall Sensor;" 2007 IEEE Sensors Conference; Oct. 28-31, 2007; pp. 860-863.
Gerhauser; "Intelligente 3D-Magnetfeld Snesorik;" Fraunhofer-Institut for Integrierte Schaltungen IIS; www.iis.fraunhofer.de/asic/ analog; Oct. 2009; 2 pages.
Melexis Microelectronic Integrated Systems; MLX90333; "Triaxis 3D-Joystick Position Sensor;" Data Sheet; Mar. 2009; 43 pages.
MEMSIC Corporation; AN-00MM-004; "Electronic Tilt Compensation;" Mar. 2008; 5 pages.
MEMSIC Corporation; AN-00MM-003; "Magnetic Sensor Caiibration;" Mar. 2008; 5 pages.
MEMSIC Corporation; AN-00MM-002: "Magnetometer Soldering Methodology;" Jun. 2008; 2 pages.
MEMSIC Corporation; AN-00MM-001; "Magnetometer Fundamentals;" Jun. 2008; 6 pages.
MEMSIC Corporation; AN-00MM-005; "Magnetic Sensor Piecement Guidelines;" Oct. 2008; 2 pages.
MEMSIC Corporation: MMC312xMQ; "Tri-axis Magnetic Sensor, with I²C Interface;" Aug. 14, 2008; 9 pages.
MEMSIC Corporation; MMC314xMS; "Ultra Small 3-axis Magnetic Sensor, with I²C Interface;" Mar. 31, 2016; 8 pages.
Micronas GmbH; "HAL® 3625 Programmable Direct Angle Sensor;" Product Information; Sep. 2009; 2 pages.
Petrie; "Circular Vertical Hall Magnetic Field Sensing Element and Method with a Plurality of Continuos Output Signals;" U.S. Appl. No. 13/035,243; filed Feb. 25, 2011; 56 pages.
Kejik et al.; "Purely CMOS Angular Position Sensor Based on a New Hall Microchip;" IEEE 34th Annual Conference of Industrial Electronics, 2008; Nov. 2008; pp. 1777-1781.

(56) References Cited

OTHER PUBLICATIONS

PCT Invitation to Pay Additional Fees dated Mar. 24, 2014; for Pat. App. No. PCT/US2013/071619; 7 pages.
PCT International Search Report and Written Opinion of the ISA dated Jul. 25, 2014; for Pat. App. No. PCT/US2013/071619; 22 pages.
PCT Notice Concerning Availability of Publication dated Sep. 18, 2014; for Pat. App. No. PCT/US2013/071619; 1 page.
PCT Second and Supplementary Notice Informing Applicant of Communication dated Apr. 23, 2015; for Pat. App. No. PCT/US2013/071619; 1 page.
European Patent Office Entry Into the European Phase dated May 4, 2015; for Pat. App. No. PCT/US2013/071619; 4 pages.
European Patent Office Communication Pursuant to Rules 161(1) and 162 EPC dated Jul. 24, 2015; for Pat. App. No. 13811286.7-1560; 2 pages.
Office Action dated Jul. 3, 2015; for U.S. Appl. No. 13/727,080; 43 pages.
Response filed Oct. 30, 2015 to Non-Final Office Action dated Aug. 3, 2015; for U.S. Appl. No. 13/724,080, 15 pages.
Response with RCE filed on Apr. 27, 2016 to the Final Office Action dated Feb. 5, 2016; for U.S. Appl. No. 13/724,080; 17 pages.
Notice of Allowance dated May 17, 2016; for U.S. Appl. No. 13/724,080; 10 pages.
Response dated Feb. 3, 2016 to European Office Action dated Jul. 24, 2015 with Amended Specification Specification and Amended Claims; for European Pat. App. No. 13811286.7; 16 pages.
Response dated Feb. 3, 2016 to European Office Action dated Jul. 24, 2015 with Amended Specification and Amended Claims; for European Pat. App. No. 13815237.6; 8 pages.
Final Office Action dated Feb. 5, 2016 corresponding to U.S. Appl. No. 13/724,080; 39 pages.
Notice of Alloeance dated Sep. 29, 2016; for U.S. Appl. No. 15/186,433; 9 pages.
Non-Final Office Action dated Jul. 14, 2016; for U.S. Appl. No. 15/186,433; 29 pages.
Response filed Jul. 15, 2016 to the Non-Final Office Action dated Jul. 14, 2016; for U.S. Appl. No. 15/186,433; 3 pages.
U.S. Appl. No. 15/186,433, Jun. 18, 2016, Friedrich et al.
312 Amendment filed Jun. 16, 2016; for U.S. Appl. No. 13/724,080; 9 pages.
RCE filed Jun. 17, 2016; for U.S. Appl. No. 13/724,080; 3 pages.

\* cited by examiner

MAGNETIC FIELD SENSOR ARRANGEMENTS AND ASSOCIATED METHODS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensor arrangements and, more particularly, to a magnetic field sensor arrangement for which a magnetic field sensor is oriented relative to a magnet in a particular ways.

BACKGROUND OF THE INVENTION

Planar Hall elements and vertical Hall elements are known types of magnetic field sensing elements that can be used in magnetic field sensors. A planar Hall element tends to be responsive to (i.e., have a major response axis aligned with) magnetic fields perpendicular to a surface of a substrate on which the planar Hall element is formed. A vertical Hall element tends to be responsive to (i.e., have a major response axis aligned with) magnetic fields parallel to a surface of a substrate on which the vertical Hall element is formed.

Other types of magnetic field sensing elements are known. For example, a so-called "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (and optionally a strength) of a magnetic field in a plane of the substrate. A CVH sensing elements tends to be responsive to (i.e., have a major response axis aligned with) magnetic fields parallel to a surface of the substrate on which the CVH sensing element is formed Various parameters characterize the performance of magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

Another parameter that can characterize the performance of a CVH sensing element is the speed with which output signals from vertical Hall elements within the CVH sensing element can be sampled, and thus, the speed with which a direction of a magnetic field can be identified. Yet another parameter that can characterize the performance of a CVH sensing element is the resolution (e.g., angular step size) of the direction of the magnetic field that can be reported by the CVH sensing element.

As described above, the CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation, and/or a rotation speed, and/or a rotation direction, of the target object.

Some conventional magnetic field sensor arrangements position a magnetic field sensor and associated magnetic field sensing element along an axis of rotation of a ring magnet configured to rotate, the ring magnet coupled to a target object. In these arrangements, the magnetic field sensor is disposed such that the major response axis of the magnetic field sensing element within the magnetic field sensor is perpendicular to the axis of rotation of the ring magnet and parallel to a major surface of the ring magnet.

Other conventional magnetic field sensor arrangements position a magnetic field sensor and associated magnetic field sensing element proximate to a line magnet configured to move linearly, the line magnet coupled to a target object.

However, due to mechanical constraints, the conventional orientations of a magnetic field sensor relative to a magnet may not be achievable in all installations of the magnetic field sensor. Furthermore, the conventional orientations may not achieve a closest distance between the magnetic field sensing element and the magnet, which is desirable for high sensitivity. Therefore it is desirable to provide a magnetic field sensor arrangement for which the magnetic field sensor is positioned such that a magnetic field sensing element therein has an axis of sensitivity not parallel to a surface of the associated magnet.

SUMMARY OF THE INVENTION

The present invention provides a magnetic field sensor arrangement for which a magnetic field sensor is positioned such that a magnetic field sensing element therein has an axis of sensitivity not parallel to a surface of an associated magnet.

In accordance with one aspect of the present invention, a magnetic field sensor arrangement includes a magnet having two opposing surfaces separated by a magnet thickness and having at least one north pole disposed proximate to at least one south pole. A line between a center of the at least one north pole and a center of the at least one south pole lies in an x-y plane. The magnetic field sensor arrangement also includes a magnetic field sensor comprising a magnetic field sensing element with a center and with at least one major response axis disposed in a major response plane intersecting the magnetic field sensing element. The magnetic field sensor is disposed proximate to the magnet with the major response plane within forty-five degrees of perpendicular to the x-y plane.

In another aspect of the present invention, a method of sensing a movement of an object includes attaching to the object a magnet having two opposing surfaces separated by a magnet thickness and having at least one north pole disposed proximate to at least one south pole. A line between a center of the at least one north pole and a center of the at least one south pole lies in an x-y plane. The method also includes placing proximate to the magnet a magnetic field sensor comprising a magnetic field sensing element with a center and with at least one major response axis disposed in a major response plane intersecting the magnetic field sensing element. The magnetic field sensor is disposed with the major response plane within forty-five degrees of perpendicular to the x-y plane.

With these arrangements, mechanical arrangements are provided that achieve a good sensitivity that would not be generally apparent.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
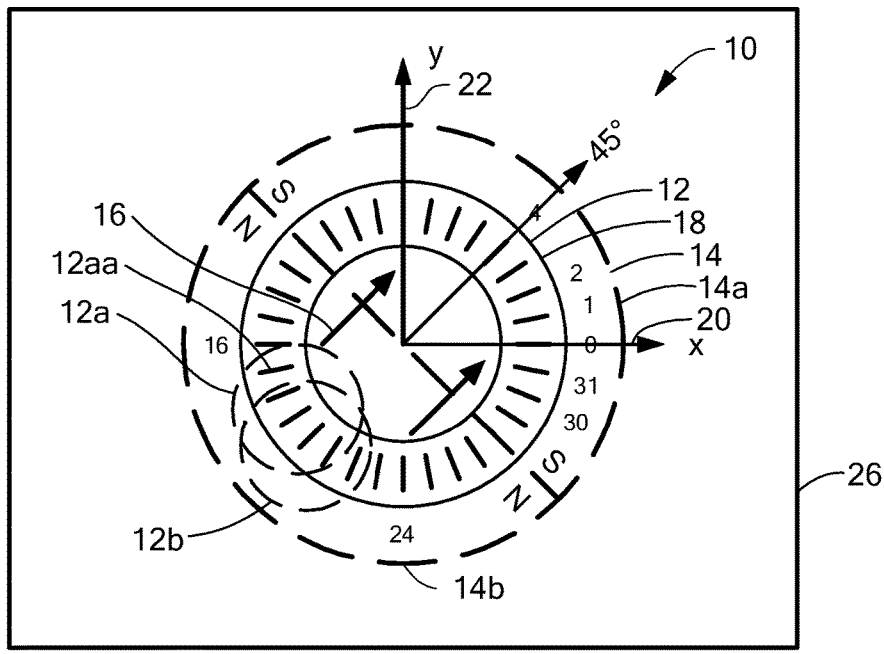
FIG. 1 is a pictorial showing a circular vertical Hall (CVH) sensing element having a plurality of vertical Hall elements arranged in a circle over a common implant region in a substrate and a two pole ring magnet disposed close to the CVH sensing element.

Before describing the present invention, some introductory concepts and terminology are explained. As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As used herein, the term "sensor" is used to describe a circuit or assembly that includes a sensing element and other components. In particular, as used herein, the term "magnetic field sensor" is used to describe a circuit or assembly that includes a magnetic field sensing element and electronics coupled to the magnetic field sensing element.

As used herein, the term "center" is used to indicate a point equidistant from or at the average distance from all points on the sides or outer boundaries of an object, which may be a three dimensional object. Unless otherwise specified, the term "center" is used in a three-dimensional sense to indicate a three dimensional center.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While a circular vertical Hall (CVH) magnetic field sensing element, which has a plurality of vertical Hall magnetic field sensing elements, is described in examples below, it should be appreciated that the same or similar techniques apply to any type of magnetic field sensing elements and to any type of magnetic field sensors. In particular, techniques apply to one or more separate vertical Hall elements or separate magnetoresistance elements, not arranged in a CVH structure, and with or without associated electronic circuits.

Referring to FIG. 1, a circular vertical Hall (CVH) sensing element 12 includes a circular implant region 18 having a plurality of vertical Hall elements disposed thereon, of which a vertical Hall element 12a is but one example. Each vertical Hall element has a plurality of Hall element contacts (e.g., four or five contacts), of which a vertical Hall element contact 12aa is but one example.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the exemplary CVH 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a south side 14a and a north side 14b can be disposed over the CVH 12. The circular magnet 14 tends to generate a magnetic field 16 having a direction from the north side 14a to the south side 14b, here shown to be pointed to a direction of about forty-five degrees relative to x-axis 20. Other magnets having other shapes and configurations are possible.

In some applications, the circular magnet 14 is mechanically coupled to a rotating object (a target object), for example, an automobile crank shaft or an automobile camshaft, and is subject to rotation relative to the CVH sensing element 12. With this arrangement, the CVH sensing element 12 in combination with an electronic circuit described below can generate a signal related to the angle of rotation of the magnet 14.

The CVH sensing element 12 can be disposed upon a substrate 26, for example, a silicon substrate, along with other electronics (not shown).

A center 24 of the CVH sensing element 12 is at a center of the entire CVH sensing element 12. Since the CVH sensing element 12 has very little depth (into the page), the center 24 can be considered to be on the surface of the substrate 26.

Figure 1A:
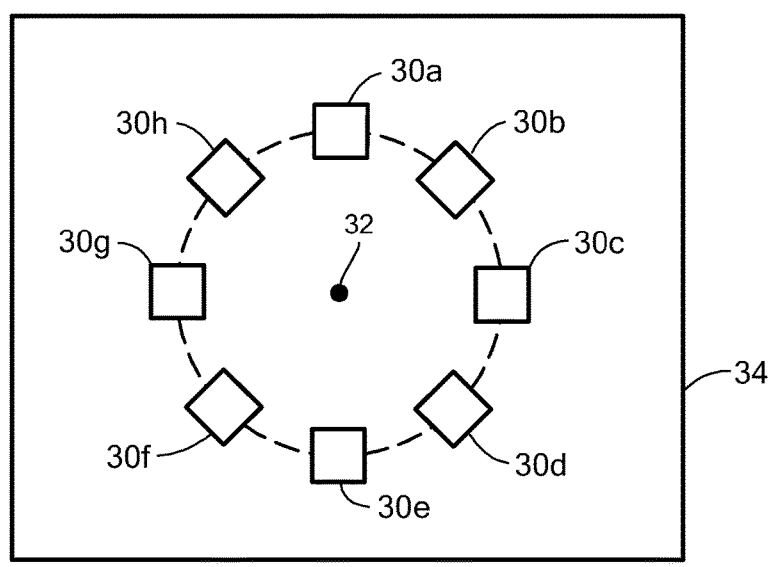
FIG. 1A is a pictorial showing a plurality of magnetic field sensing elements, for example, vertical Hall elements or magnetoresistance elements, upon a substrate.

Referring now to FIG. 1A, a plurality of magnetic field sensing elements 30a-30h (or alternatively, sensors), in a general case, can be any type of magnetic field sensing elements. The magnetic field sensing elements 30a-30h can be, for example, planar Hall elements, vertical Hall elements, or magnetoresistance elements. These elements can also be coupled to an electronic circuit described below. For embodiments where the sensing elements 30a-30h are vertical Hall elements or magnetoresistance elements, there can also be a magnet the same as or similar to the magnet 14 of FIG. 1, disposed proximate to the sensing elements 30a-30h in the same way as is shown in FIG. 1.

The group of sensing elements 30a-30h can be disposed upon a substrate 34, for example, a silicon substrate, along with other electronics (not shown).

A center 32 of the plurality of magnetic field sensing elements 30a-30h is at a center of the entire group of magnetic field sensing elements 30a-30h. Since the magnetic field sensing elements 30a-30h have very little depth (into the page), the center 32 can be considered to be on the surface of the substrate 34.

Figure 1B:
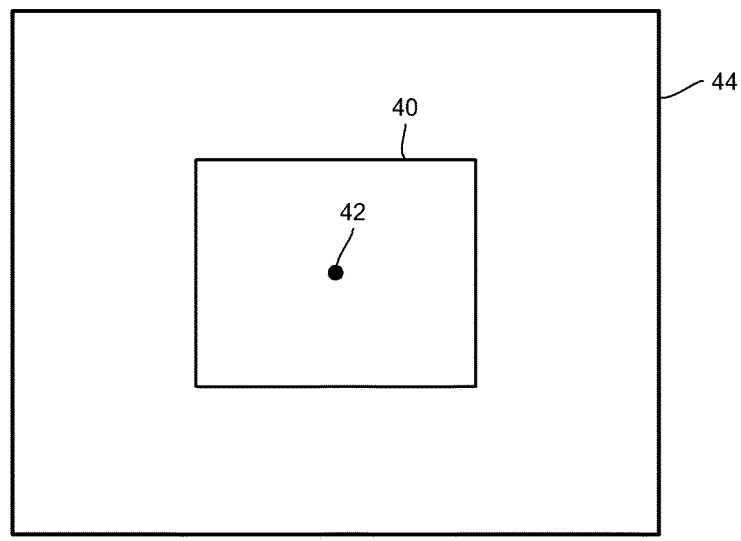
FIG. 1B is a pictorial showing a magnetic field sensing element upon a substrate.

Referring now to FIG. 1B, a magnetic field sensing element 40 can be a single element, for example, a single vertical Hall element or a single magnetoresistance element, disposed upon a substrate 44 along with other electronics (not shown).

A center 42 of the magnetic field sensing element 40 is at a center of the magnetic field sensing element 40. Since the magnetic field sensing element has very little depth (into the page), the center 42 can be considered to be on the surface of the substrate 44.

Figure 2:
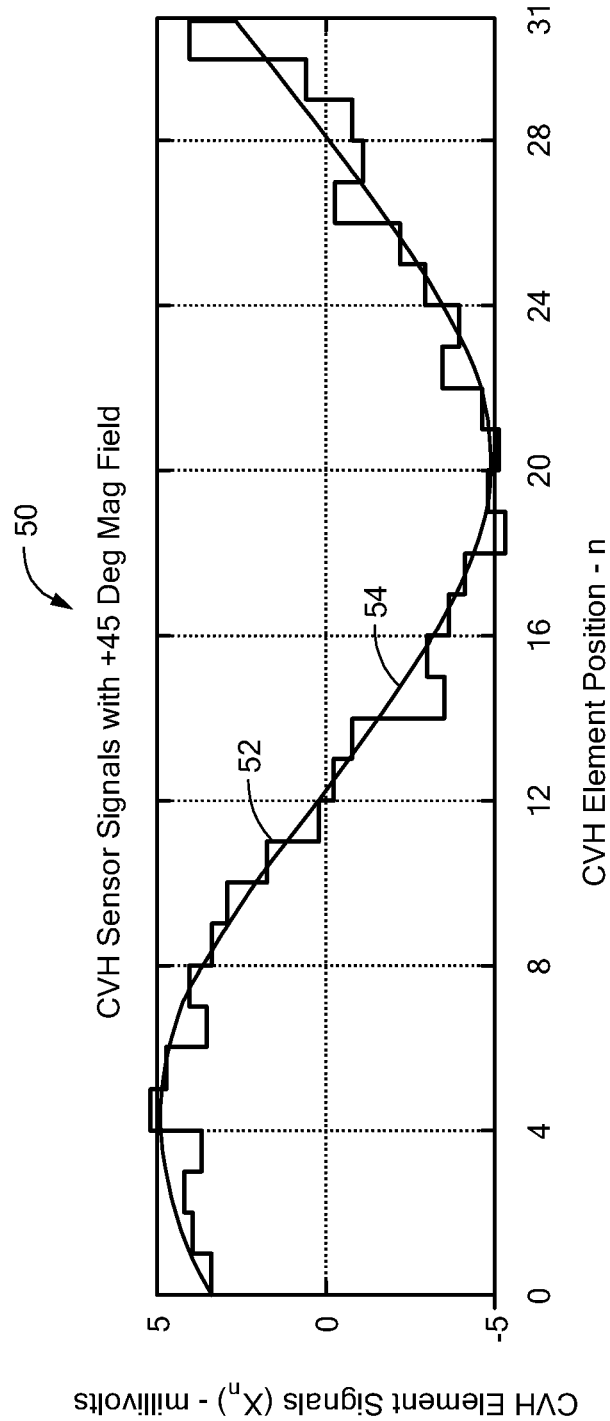
FIG. 2 is a graph showing an output signal as may be generated by the CVH sensing element of FIG. 1 or by the magnetic field sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts.

The graph 50 includes a signal 52 representative of output signal levels from the plurality of vertical Hall elements of the CVH taken sequentially with the magnetic field of FIG. 1 stationary and pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show the ideal behavior of the signal 52. The signal 52 has variations due to vertical Hall element offsets, which tend to somewhat randomly cause element output signals to be too high or too low relative to the sine wave 54, in accordance with offset errors for each element. The offset signal errors are undesirable. In some embodiments, the offset errors can be reduced by "chopping" each vertical Hall element. Chopping will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

As will be understood from PCT Patent Application No. PCT/EP2008/056517, groups of contacts of each vertical Hall element can be used in a multiplexed or chopped arrangement to generate chopped output signals from each vertical Hall element. Thereafter, or in parallel (i.e., at the same time), a new group of adjacent vertical Hall element contacts can be selected (i.e., a new vertical Hall element), which can be offset by one or more elements from the prior group. The new group can be used in the multiplexed or chopped arrangement to generate another chopped output signal from the next group, and so on.

Each step of the signal 52 can be representative of a chopped output signal from one respective group of vertical Hall element contacts, i.e., from one respective vertical Hall element. However, in other embodiments, no chopping is performed and each step of the signal 52 is representative of an unchopped output signal from one respective group of vertical Hall element contacts, i.e., from one respective vertical Hall element. Thus, the graph 52 is representative of a CVH output signal with or without the above-described grouping and chopping of vertical Hall elements.

It will be understood that, using techniques described above in PCT Patent Application No. PCT/EP2008/056517, a phase of the signal 52 (e.g., a phase of the signal 54) can be found and can be used to identify the pointing direction of the magnetic field 16 of FIG. 1 relative to the CVH sensing element 12.

Figure 3:
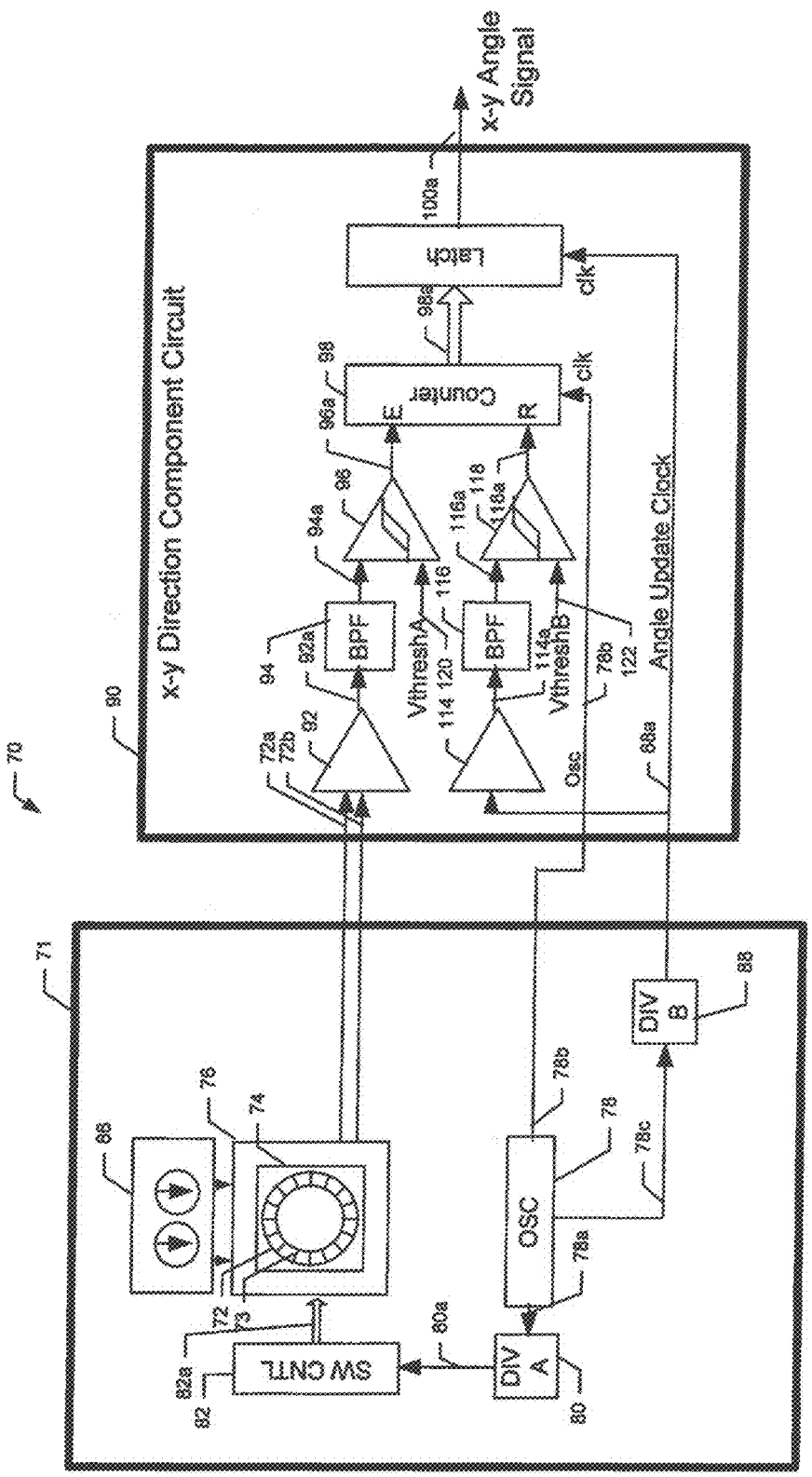
FIG. 3 is a block diagram showing an electronic circuit using a CVH sensing element to determine a direction of a sensed magnetic field.

Referring now to FIG. 3, a magnetic field sensor 70 includes a sensing portion 71. The sensing portion 71 can include a CVH sensing element 72 having a plurality of CVH sensing element contacts, e.g., a CVH sensing element contact 73. In some embodiments there are thirty-two vertical Hall elements in the CVH sensing element 72 and a corresponding thirty-two CVH sensing element contacts. In other embodiments there are sixty-four vertical Hall elements in the CVH sensing element 72 and a corresponding sixty-four CVH sensing element contacts. However, a CVH sensing element can have more than or fewer than thirty-two vertical Hall elements and more than or fewer than thirty-two CVH sensing element contacts.

A magnet (not shown) can be disposed proximate to the CVH sensing element 72, and can be coupled to a target object (not shown). The magnet can be the same as or similar to the magnet 14 of FIG. 1

As described above, the CVH sensing element 72 can have a plurality of vertical Hall elements, each vertical Hall element comprising a group of vertical Hall element contacts (e.g., five vertical Hall element contacts), of which the vertical Hall element contact 73 is but one example.

In some embodiments, a switching circuit 74 can provide sequential CVH differential output signals 72a, 72b from the CVH sensing element 72.

The CVH differential output signal 72a, 72b is comprised of sequential output signals taken one-at-a-time around the CVH sensing element 72, wherein each output signal is generated on a separate signal path and switched by the switching circuit 74 into the path of the differential output signal 72a, 72b. The signal 52 of FIG. 2 can be representative of the differential signal 72a, 72b. Therefore, the CVH differential output signal 72a, 72b can be represented as a switched set of CVH output signals $x_n = x_0$ to $x_{N-1}$, taken one at a time, where n is equal to a vertical Hall element position (i.e., a position of a group of vertical Hall element contacts that form a vertical Hall element) in the CVH sensing element 72, and where there are N such positions.

In one particular embodiment, the number of vertical Hall elements (each comprising a group of vertical Hall element contacts) in the CVH sensing element 72 is equal to the total number of sensing element positions, N. In other words, the CVH differential output signal 72a, 72b can be comprised of sequential output signals, wherein the CVH differential output signal 72a, 72b is associated with respective ones of the vertical Hall elements in the CVH sensing element 72 as the switching circuit 74 steps around the vertical Hall elements of the CVH sensing element 72 by increments of one, and N equals the number of vertical Hall elements in the CVH sensing element 72. However, in other embodiments, the increments can be by greater than one vertical Hall element, in which case N is less than the number of vertical Hall elements in the CVH sensing element 72.

In one particular embodiment, the CVH sensing element 72 has thirty-two vertical Hall elements, i.e., N=32, and each step is a step of one vertical Hall element contact position (i.e., one vertical Hall element position). However, in other embodiments, there can be more than thirty-two or fewer than thirty-two vertical Hall elements in the CVH sensing element 72, for example sixty-four vertical Hall elements. Also, the increments of vertical Hall element positions, n, can be greater than one vertical Hall element contact.

In some embodiments, another switching circuit 76 can provide the above-described "chopping" of groups of the vertical Hall elements within the CVH sensing element 72. Chopping will be understood to be an arrangement in which a group of vertical Hall element contacts, for example, five vertical Hall element contacts that form one vertical Hall element, are driven with current sources 86 in a plurality of different connection configurations, and signals are received from the group of vertical Hall element contacts in corresponding different configurations to generate the CVH differential output signal 72a, 72b. Thus, in accordance with each vertical Hall element position, n, there can be a plurality of sequential output signals during the chopping, and then the group increments to a new group, for example, by an increment of one vertical Hall element contact.

The sensing portion 71 can also include current sources 86 configured to drive the CVH sensing element 72 when the CVH sensing element 72.

While current sources 86 are shown, in other embodiments, the current sources 86 can be replaced by voltage sources.

The magnetic field sensor 70 includes an oscillator 78 that provides clock signals 78a, 78b, 78c, which can have the same or different frequencies. A divider 80 is coupled to receive the clock signal 78a and configured to generate a divided clock signal 80a. A switch control circuit 82 is coupled to receive the divided clock signal 80a and configured to generate switch control signals 82a, which are received by the switching circuits 74, 76 to control the sequencing around the CVH sensing element 72, and optionally, to control the chopping of groups of vertical Hall elements within the CVH sensing element 72 in ways described above.

The magnetic field sensor 70 can include a divider 88 coupled to receive the clock signal 78c and configured to generate a divided clock signal 88a, also referred to herein as an "angle update clock" signal.

The magnetic field sensor 70 also includes an x-y direction component circuit 90. The x-y direction component circuit 90 can include an amplifier 92 coupled to receive the CVH differential output signals 72a, 72b. The amplifier 92 is configured to generate an amplified signal 92a. A bandpass filter 94 is coupled to receive the amplified signal 92a and configured to generate a filtered signal 94a. A comparator 96, with or without hysteresis, is configured to receive the filtered signal 94a. The comparator 96 is also coupled to receive a threshold signal 120. The comparator 96 is configured to generate a thresholded signal 96a generated by comparison of the filtered signal 94a with the threshold signal 120.

The x-y direction component circuit 90 also includes an amplifier 114 coupled to receive the divided clock signal 88a. The amplifier 114 is configured to generate an amplified signal 114 a. A bandpass filter 116 is coupled to receive the amplified signal 114a and configured to generate a filtered signal 116a. A comparator 118, with or without hysteresis, is coupled to receive the filtered signal 116a. The comparator 118 is also coupled to receive a threshold signal 122. The comparator 118 is configured to generate a thresholded signal 118a by comparison of the filtered signal 116a with the threshold signal 122.

The bandpass filters 94, 116 can have center frequencies equal to l/T, where T is the time that it takes to sample all of the vertical Hall elements within the CVH sensing element 72.

It should be understood that the amplifier 114, the bandpass filter 116, and the comparator 118 provide a delay of the divided clock signal 88a in order to match a delay of the circuit channel comprised of the amplifier 92, the bandpass filter 94, and the comparator 96. The matched delays provide phase matching, in particular, during temperature excursions of the magnetic field sensor 70.

A counter 98 can be coupled to receive the thresholded signal 96a at an enable input, to receive the clock signal 78b at a clock input, and to receive the thresholded signal 118a at a reset input.

The counter 98 is configured to generate a phase signal 98a having a count representative of a phase difference between the thresholded signal 96a and the thresholded signal 118a.

The phase shift signal 98a is received by a latch 100 that is latched upon an edge of the divided clock signal 88a. The latch 100 is configured to generate a latched signal 100a, also referred to herein as an "x-y angle signal."

It will be apparent that the latched signal 100a is a multi-bit digital signal that has a value representative of a direction of an angle of the magnetic field experience by the CVH sensing element 72, and thus, an angle of the magnet and target object.

In some embodiments, the clock signals 78a, 78b, 78c each have a frequency of about 30 MHz, the divided clock signal 80a has a frequency of about 8 MHz, and the angle update clock signal 88a has a frequency of about 30 kHz. However in other embodiments, the initial frequencies can be higher or lower than these frequencies With the magnetic field sensor 70, it will be appreciated that an update rate of the x-y angle signal 100a occurs at a rate equivalent to a rate at which all of the vertical Hall elements within the CVH sensing element 72 are collectively sampled.

Figure 4:
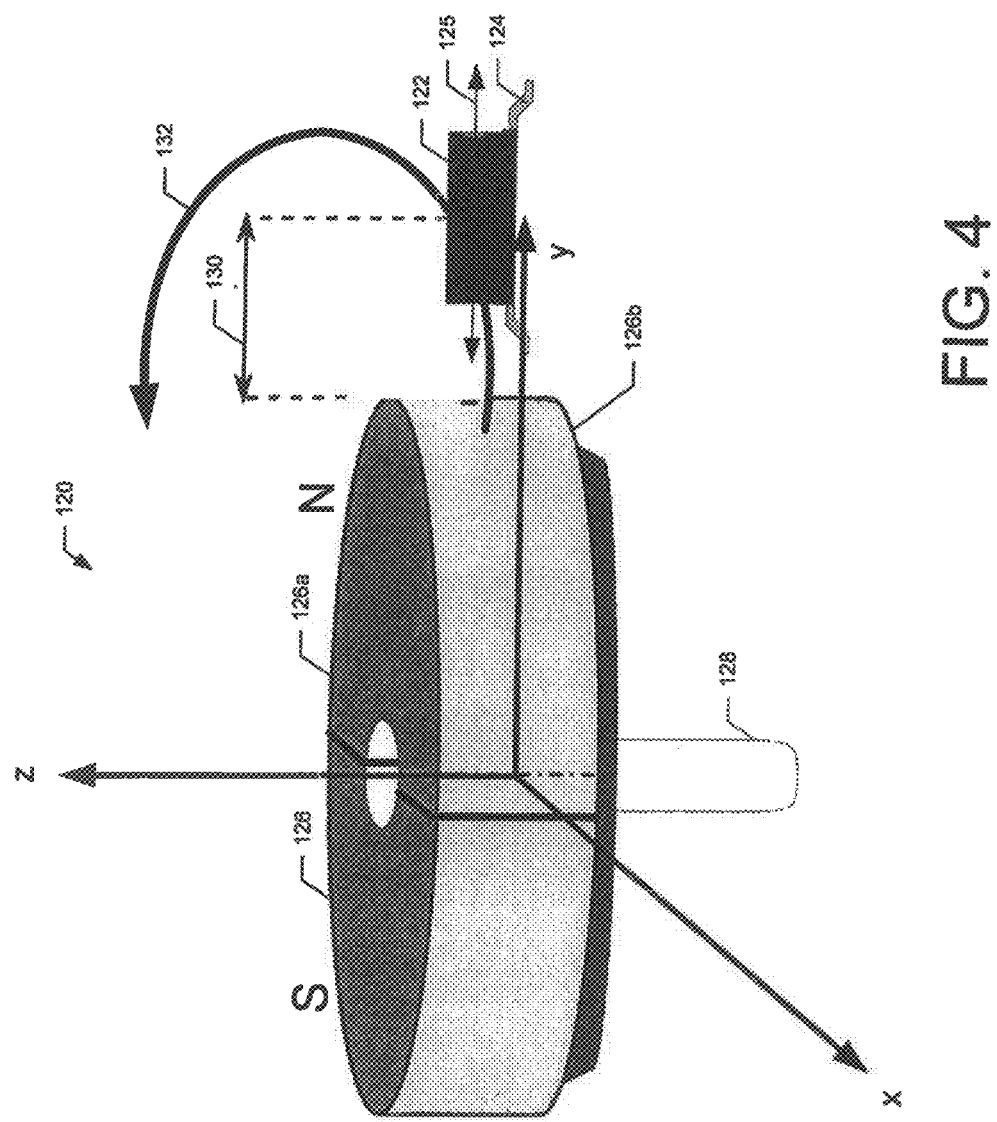
FIG. 4 is a pictorial showing a magnetic field sensor arrangement having a magnetic field sensor proximate to a ring magnet configured to rotate.

Referring now to FIG. 4, a magnetic field sensor arrangement 120 includes a magnet 126 (e.g., a ring magnet) having two opposing surfaces 126a, 126b separated by a magnet thickness. In some embodiments, the surfaces 126a, 126b are flat and/or parallel. However, in other embodiments, the surfaces 126a, 126b of the magnet 126 can be irregular.

The magnet 126 has at least one north pole and at least one south pole, but can have a plurality of north poles and/or a plurality of south poles. A line (not shown) between a center of the at least one north pole and a center of the at least one south pole lies in an x-y plane (axes shown).

The magnet 126 can be coupled to a target object 128, for example, a shaft configured to rotate.

A magnetic field sensor 122 has a magnetic field sensing element (not shown) disposed therein upon a substrate (not shown). The magnetic field sensor 122 can be comprised of circuits the same as or similar to the magnetic field sensor 70 of FIG. 3.

The magnetic field sensor 122 can have leads, of which a lead 124 is but one example, which are configured to couple to or solder to a circuit board (not shown). The magnetic field sensor and magnetic field sensing element therein have at least one major response axis 125 disposed in a major response plane (e.g., parallel to the x-y plane) in which direction the magnetic field sensing element is most sensitive and perpendicular to which the magnetic field sensing element has little or no sensitivity.

It will be understood from discussion above that a CVH sensing element has a plurality of major response axes disposed in a major response plane.

In the magnetic field sensor arrangement 120, the magnetic field sensor 122 is disposed relative to the magnet 126 in an orientation as shown, such that the major response axis 125 is disposed in a major response plane parallel to and between planes of the first and second surfaces 126a, 126b, respectively.

In other embodiments, the magnetic field sensor 122 is disposed so that the major response axis 125 does not pass between planes of the first and second surfaces 126a, 126b.

The magnetic field sensor 122 is disposed at a distance 130 away from an edge of the magnet 126.

Magnetic field lines, of which a magnetic field line 132 is but one example, take a variety of paths from the north pole to the south pole, but at the edge of the magnet 126 generally follow a circuitous path from the north pole to the south pole. The magnetic field line 132 is representative of a portion of one of the circuitous paths. The magnetic field sensor 122 is responsive to the magnetic field, e.g., 132.

The magnetic field sensor 122 is disposed such that the distance 130 is small and such that the magnetic field line 132 passes through the magnetic field sensor 122 and with a direction generally parallel to the major response axis 125.

In other embodiments, the magnet 126 has a plurality of north poses and a plurality of south poles.

It will be recognized that, a smaller distance 130 results in a higher magnetic field sensed by the magnetic field sensor 122 and magnetic field sensing elements therein. However, this orientation of the magnetic field sensor 122, particularly when coupled to a circuit board (not shown), results in a comparatively large distance 130 between the magnetic field sensor 122, and in particular, the magnetic field sensing element (not shown) within the magnetic field sensor 122, and the magnet 126.

Figure 5:
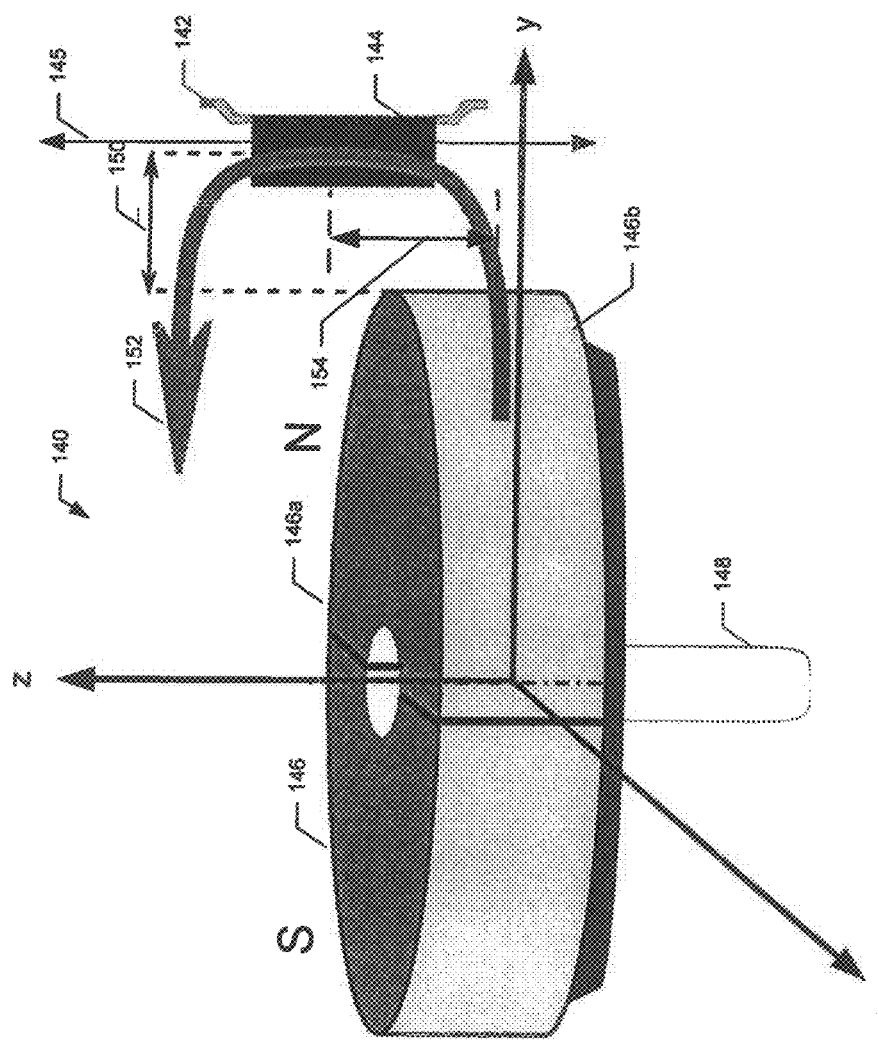
FIG. 5 is a pictorial showing another magnetic field sensor arrangement having a magnetic field sensor proximate to a ring magnet configured to rotate.

Referring now to FIG. 5, a magnetic field sensor arrangement 140 includes a magnet 146 (e.g., a ring magnet) having two opposing surfaces 146a, 146b separated by a magnet thickness and having at least one north pole (N) disposed proximate to at least one south pole (S). In some embodiments, the surfaces 146a, 146b are flat and/or parallel. However, in other embodiments, the surfaces 146a, 146b of the magnet 146 can be irregular.

A line (not shown) between a center of the at least one north pole and a center of the at least one south pole lies in an x-y plane (axes shown).

The magnet 146 can be coupled to a target object 148, for example, a shaft configured to rotate.

A magnetic field sensor 144 has a magnetic field sensing element (not shown) with a center and with at least one major response axis 145 disposed in a major response plane intersecting the magnetic field sensing element. The magnetic field sensor 144 can be comprised of circuits the same as or similar to the magnetic field sensor 70 of FIG. 3. The magnetic field sensor 144 is disposed proximate to the magnet 146 with the major response axis 145 and major response plane within about forty-five degrees of perpendicular to the x-y plane. In some embodiments, the major response axis 145 and major response plane are perpendicular to the x-y plane.

It will be understood from discussion above that a CVH sensing element has a plurality of major response axes disposed in a major response plane.

In some embodiments, the center of the magnetic field sensing element within the magnetic field sensor 144 is disposed in a plane parallel to and between the two opposing surfaces 146a, 146b.

In other embodiments as shown, the center of the magnetic field sensing element is disposed in a plane parallel to and not between the two opposing surfaces 146a, 146b.

The magnetic field sensing element within the magnetic field sensor 144 is disposed at a distance 150 from an edge of the magnet 146 in a y direction, and at a distance 154 in the z direction. The distance 150 can be smaller than the distance 130 of FIG. 4.

Magnetic field lines, of which a magnetic field line 152 is but one example, take a variety of paths from the north pole to the south pole. The magnetic field line 152 is the same as or similar to the magnetic field line 132 of FIG. 4. The magnetic field sensor 144 is responsive to the magnetic field, e.g., 152, generated by the magnet 146.

It will be recognized that the magnetic field sensor 144 can be disposed at a position such that magnetic field lines, e.g., the magnetic field line 152, passes through the magnetic field sensor 144, and, in particular, through the magnetic field sensing element within the magnetic field sensor 144, in a direction parallel to the major response axis 145 and to the major response plane, accordingly.

In other embodiments, the magnet 146 has a plurality of north poses and a plurality of south poles.

Figure 6:
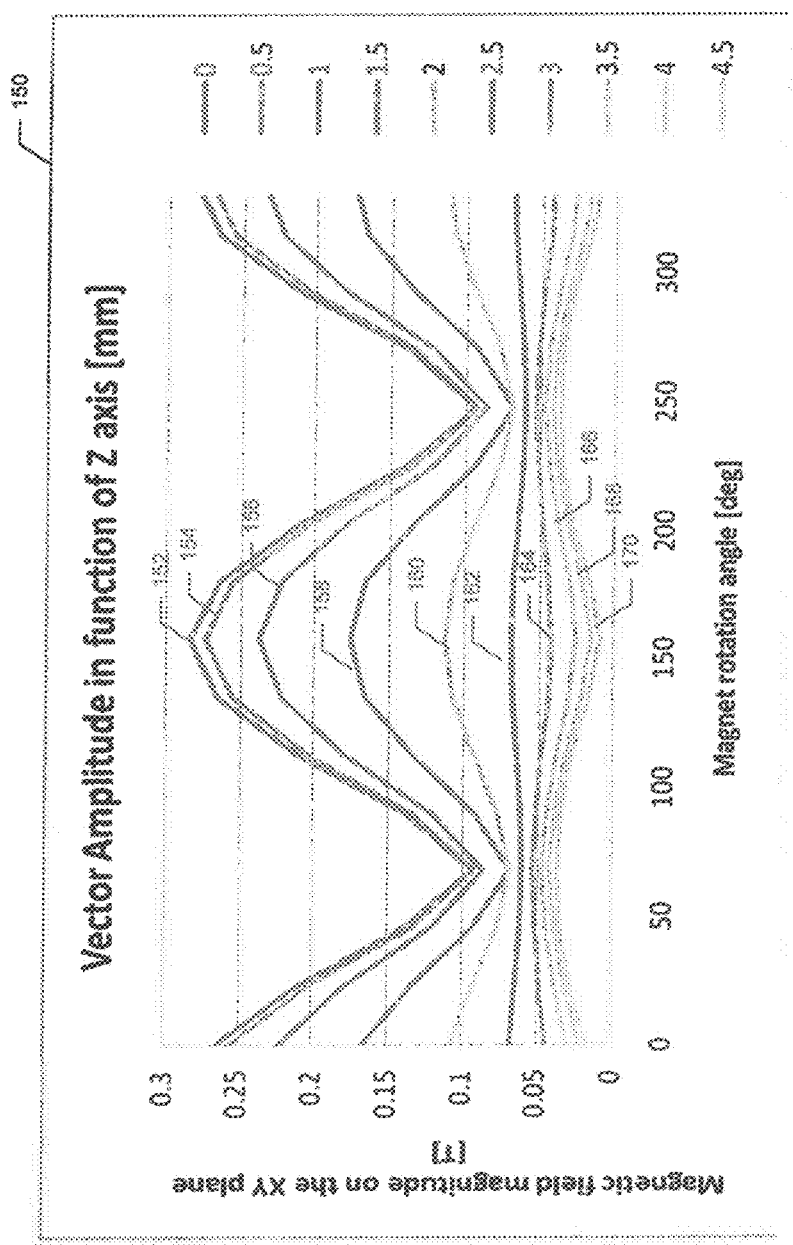
FIGS. 6-8 are graphs showing behaviors of the magnetic field sensor arrangement of FIG. 4.
Figure 7:
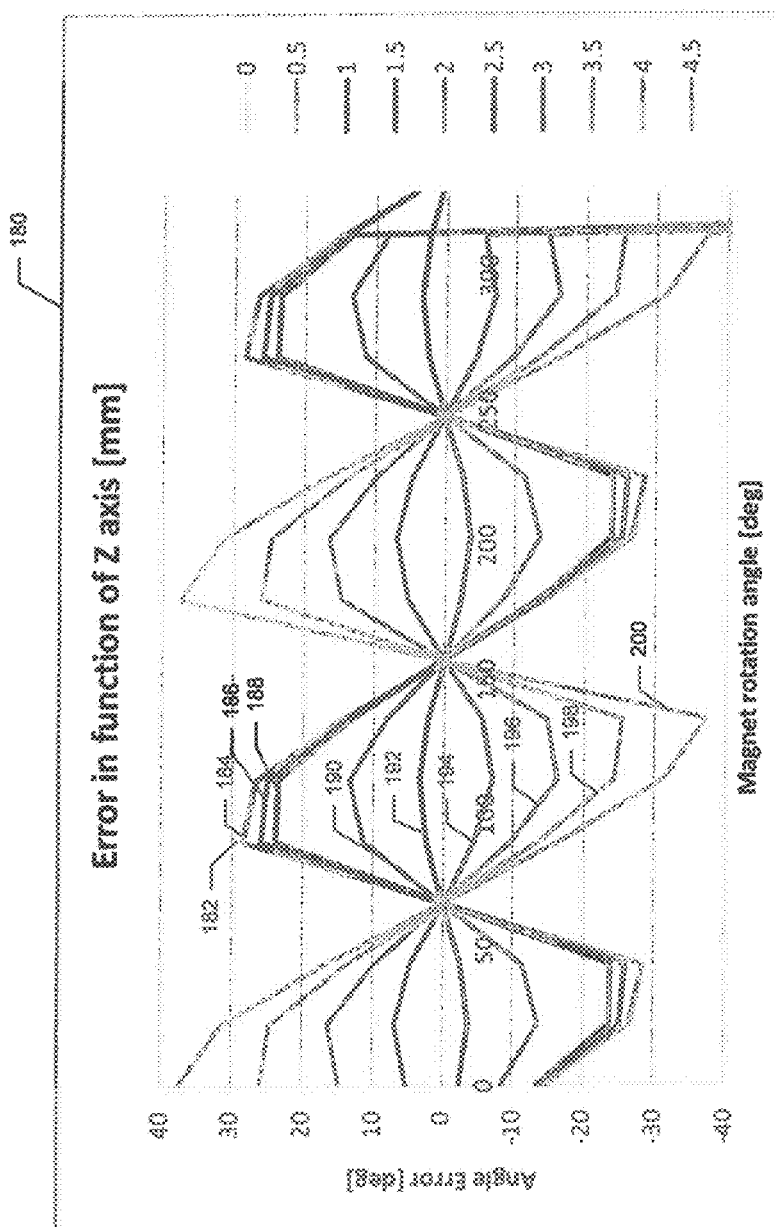
Figure 8:
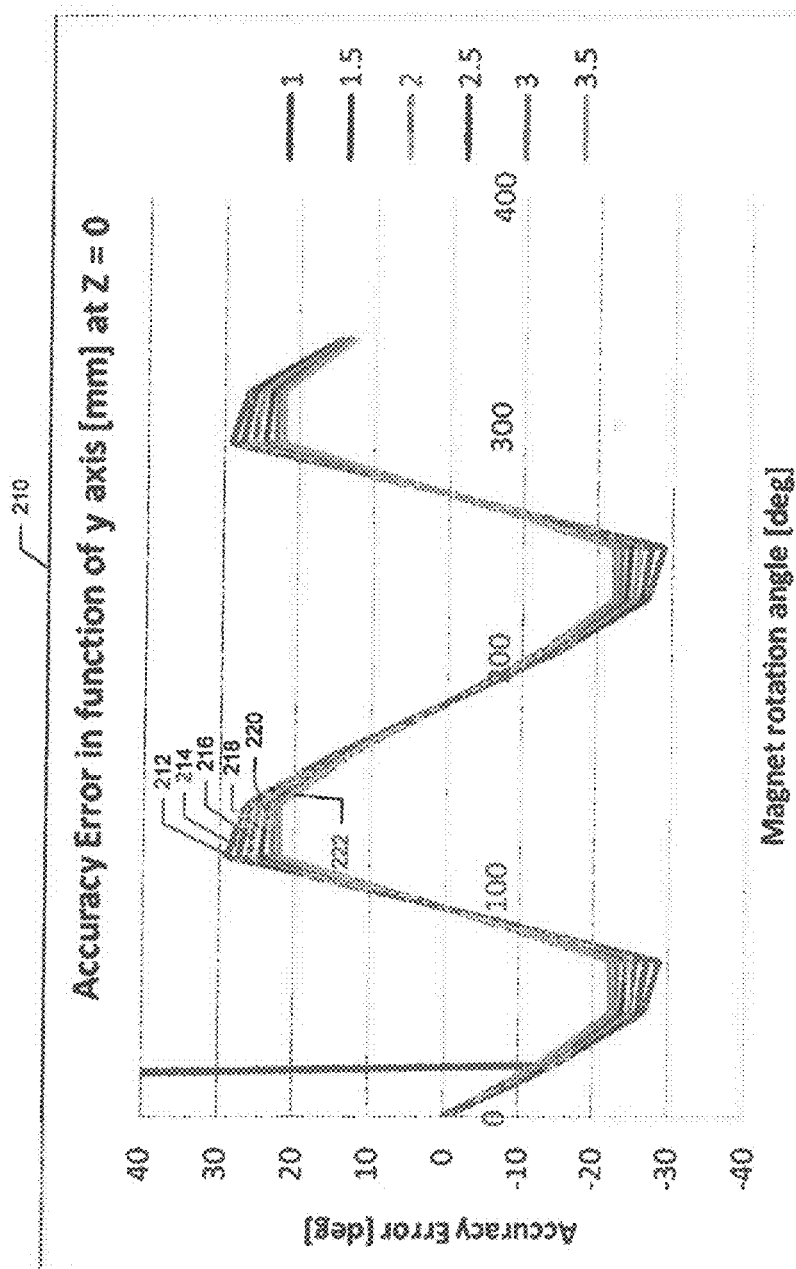
Figure 9:
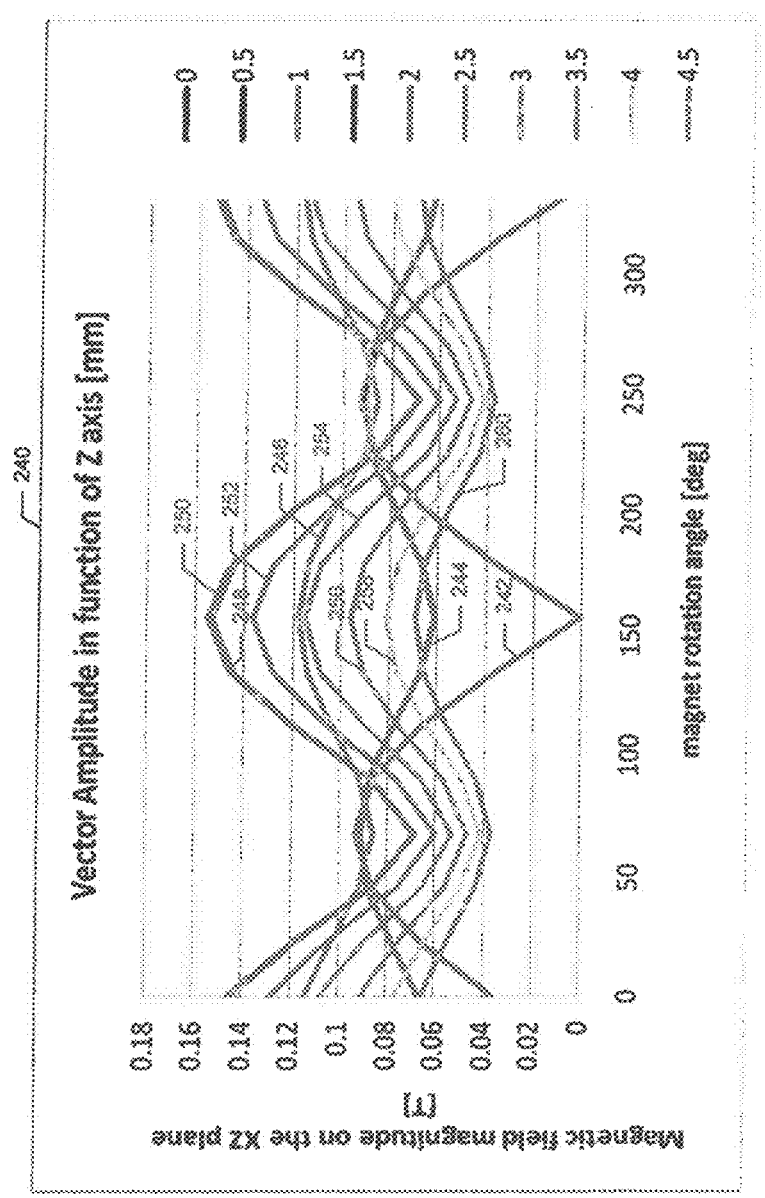
FIGS. 9-11 are graphs showing behaviors of the magnetic field sensor arrangement of FIG. 5.
Figure 10:
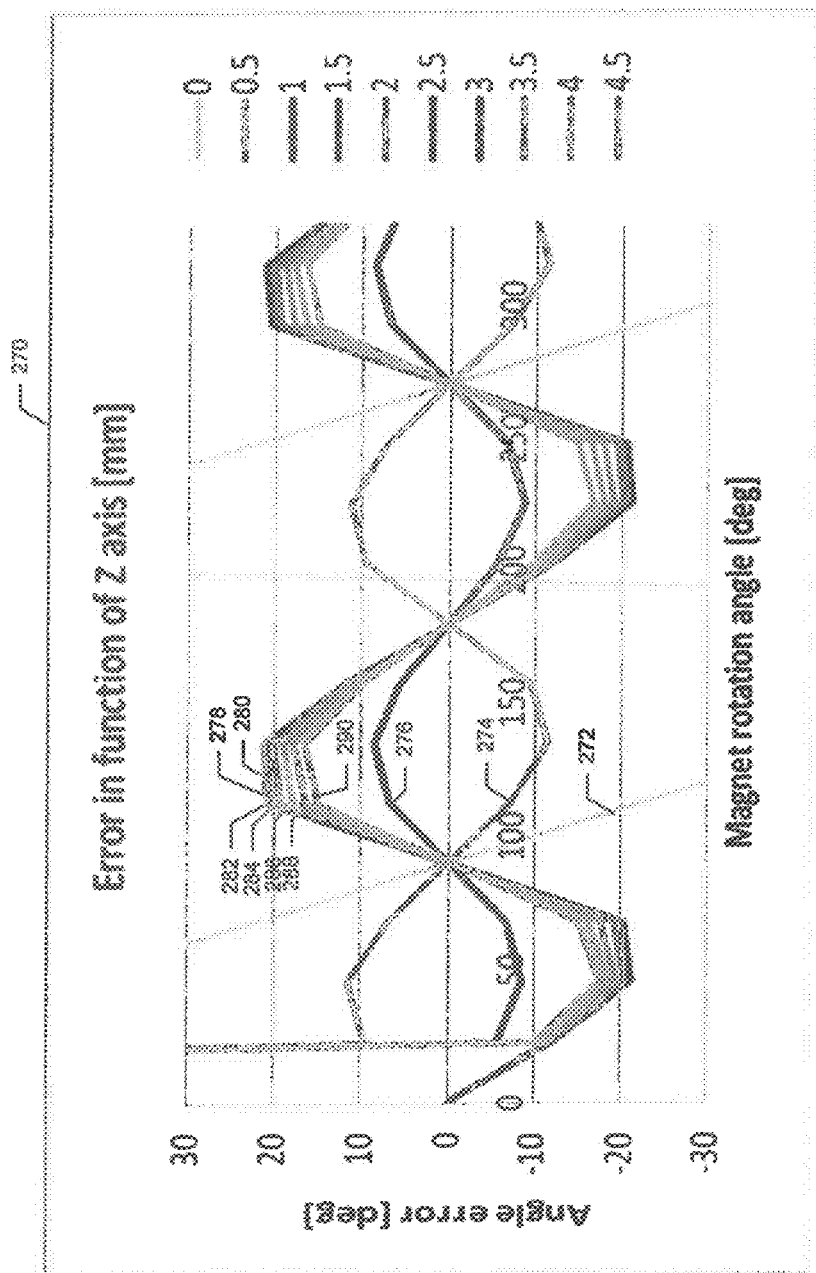
Figure 11:
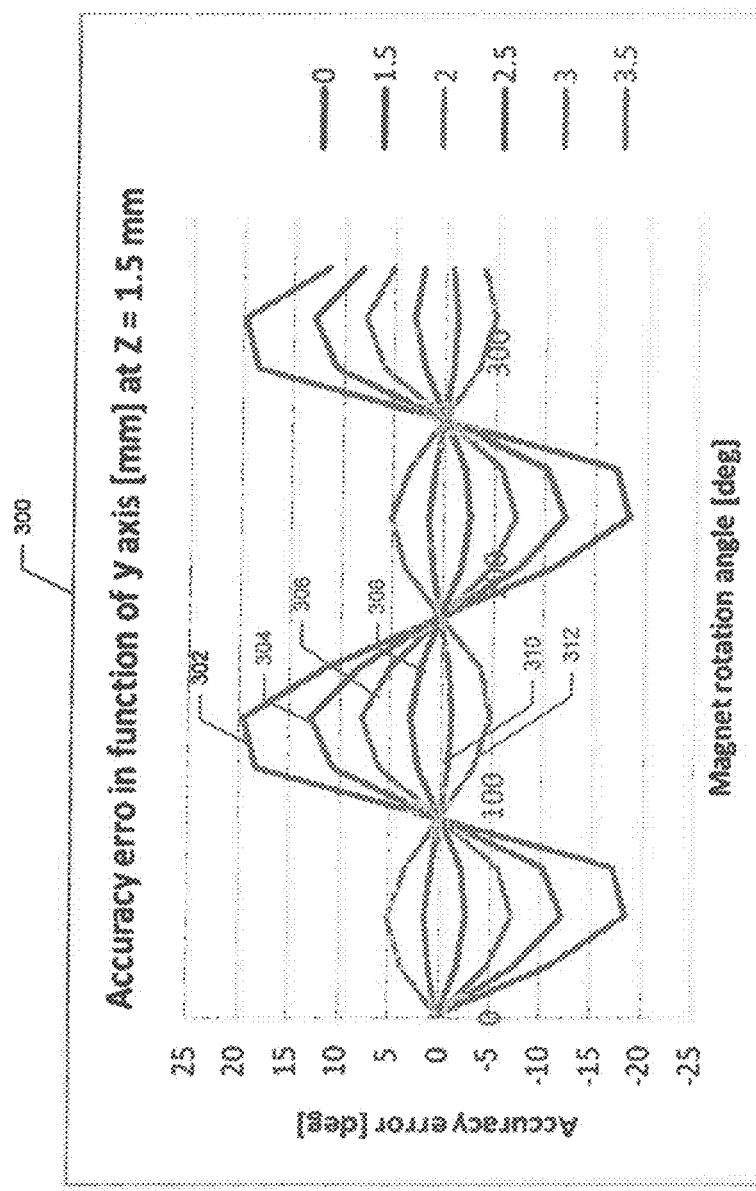

It is desirable that the magnetic field sensor 144 behaves with a sensitivity and with an error the same as or similar to the magnetic field sensor 122 of FIG. 4. Graphs shown below in FIGS. 6-8 show sensitivity and errors for the magnetic field sensor arrangement 120 of FIG. 4. Graphs shown below in FIGS. 9-11 show sensitivity and errors for the magnetic field sensor arrangement 140 of FIG. 5.

Referring now to FIG. 6, a graph 150 has a horizontal axis with a scale in units of angular rotation in degrees of a magnet, for example, the magnet 126 of FIG. 4. The graph 150 also includes a vertical axis with a scale in units of magnetic field in teslas in an x-y plane, for example, the x-y plane of FIG. 4.

Curves 152-170 are representative of magnetic fields experienced by a magnetic field sensor, for example, the magnetic field sensor 122 of FIG. 4, and in particular, a magnetic field sensing element within the magnetic field sensor 122, for different positions of the magnetic field sensor 122 in a z-direction (see axes in FIG. 4) as the magnet 126 rotates. To generate the curves 152-170, it is presumed that the magnet 126 of FIG. 4 has one north pole and one south pole. It is also presumed that the distance 130 of FIG. 4 is about 1 mm. It is also presumed that the magnet 126 has a thickness between the first and second surfaces 126a, 126b of about 3 mm.

The curve 152 is representative of a position of the magnetic field sensor 122 in the z-direction corresponding to zero millimeters, which is equivalent to the magnetic field sensor (i.e., the magnetic field sensing element within the magnetic field sensor 122) being centered upon the y-axis, which is midway between the first and second opposing surfaces 126a, 126b of the magnet 126.

The remaining curves 154-170 are representative of positions of the magnetic field sensing element in increments of 0.5 millimeters, respectively, in the z-direction of FIG. 4.

The curve 162, which corresponds to a z-direction position of 2.5 millimeters, has a small but uniform magnetic field amplitude over the 360 degrees rotation of the magnet.

Referring now to FIG. 7, a graph 180 has a horizontal axis with a scale in units of angular rotation in degrees of a magnet, for example, the magnet 126 of FIG. 4. The graph 150 also includes a vertical axis with a scale in units of estimated angular error in degrees.

Curves 182-200 are representative of angular errors of pointing directions of sensed magnetic fields versus rotation angle of the magnet 126 at a variety of positions of the magnetic field sensor 122 of FIG. 4, specifically for different positions of the magnetic field sensor circuit in a z-direction (see axes in FIG. 4) as the magnet 126 rotates. To generate the curves 182-200, it is again presumed that the magnet 126 of FIG. 4 has one north pole and one south pole. It is also presumed that the distance 130 of FIG. 4 is about 1 mm. It is also presumed that the magnet 126 has a thickness between the first and second surfaces 126a, 126b of about 3 mm.

The curve 182 (hidden behind the curve 184) is representative of a position of the magnetic field sensor 122 in the z-direction corresponding to zero millimeters, which is equivalent to the magnetic field sensor (i.e., the magnetic field sensing element within the magnetic field sensor 122) being centered upon the y-axis, which is midway between the first and second opposing surfaces 126a, 126b of the magnet 126.

The remaining curves 184-200 are representative of positions of the magnetic field sensing element in increments of 0.5 millimeters in the z-direction of FIG. 4. It can be seen that the curve 192 has a lowest angular error of about +/−four degrees. The curve 192 corresponds to an offset in the z-direction of 2.5 millimeters and corresponds to the curve 162 of FIG. 6.

Referring now to FIG. 8, a graph 210 has a horizontal axis with a scale in units of angular rotation in degrees of a magnet, for example, the magnet 126 of FIG. 4. The graph 210 also includes a vertical axis with a scale in units of estimated angular error in degrees.

Curves 212-222 are representative of angular errors of pointing directions of sensed magnetic fields versus rotation angle of the magnet 126 at a variety of positions of the magnetic field sensor 122 of FIG. 4, specifically for different positions of the magnetic field sensor 122 in the y-direction (see axes in FIG. 4) as the magnet 126 rotates. To generate the curves 212-222, it is again presumed that the magnet 126 of FIG. 4 has one north pole and one south pole. It is also presumed that the magnet 126 has a thickness between the first and second surfaces 126a, 126b of about 3 mm.

The curve 212 is representative of a position of the magnetic field sensor 122 (i.e., the magnetic field sensing element within the magnetic field sensor 122) in the y-direction corresponding to one millimeter, and centered midway between the first and second opposing surfaces 126a, 126b of the magnet 126. The curves 212-222 are generated for the z-direction position of the magnetic field sensor 122 (i.e., the magnetic field sensing element within the magnetic field sensor 122) of zero millimeters, corresponding to positions of the magnetic field sensor 122 to generate the curve 152 of FIG. 6 and curve 182 of FIG. 7.

The remaining curves 214-222 are representative of positions of the magnetic field sensing element in increments of 0.5 millimeters in the x-direction of FIG. 4. It can be seen that the curves 214-222 have roughly equivalent errors. Thus, it should be appreciated that movement or placement error of the magnetic field sensor 122 in the direction of the y-axis (i.e., changes of air gap) does not affect the accuracy of the sensed magnetic field very much.

Referring now to FIG. 9, a graph 240 has a horizontal axis with a scale in units of angular rotation in degrees of a magnet, for example, the magnet 146 of FIG. 5. The graph 240 also includes a vertical axis with a scale in units of magnetic field in teslas in an x-z plane, for example, the x-y plane of FIG. 5.

Curves 242-260 are representative of magnetic fields experienced by a magnetic field sensor, for example, the magnetic field sensor 144 of FIG. 5, and in particular, a magnetic field sensing element within the magnetic field sensor 144, for different positions of the magnetic field sensor 144 in a z-direction (see axes in FIG. 5) as the magnet 146 rotates. To generate the curves 242-260, it is presumed that the magnet 146 of FIG. 5 has one north pole and one south pole. It is also presumed that the distance 150 of FIG.

5 is about 1 mm. It is also presumed that the magnet 146 has a thickness between the first and second surfaces 146a, 146b of about 3 mm.

The curve 242 is representative of a position of the magnetic field sensor 144 in the z-direction corresponding to zero millimeters, which is equivalent to the magnetic field sensor 144 (i.e., the magnetic field sensing element within the magnetic field sensor 144) being centered upon the y-axis, which is midway between the first and second opposing surfaces 146a, 146b of the magnet 146.

The remaining curves 244-260 are representative of positions of the magnetic field sensing element in increments of 0.5 millimeters in the z-direction of FIG. 5.

The curve 246, which corresponds to a z-direction position of 1.0 millimeters, is the curve with the smallest magnetic field amplitude, leading to an optimal position in terms of sensor resolution.

Referring now to FIG. 10, a graph 270 has a horizontal axis with a scale in units of angular rotation in degrees of a magnet, for example, the magnet 146 of FIG. 5. The graph 270 also includes a vertical axis with a scale in units of estimated angular error in degrees.

Curves 272-290 are representative of angular errors of pointing directions of sensed magnetic fields versus rotation angle of the magnet 146 at a variety of positions of the magnetic field sensor 144 of FIG. 5, specifically for different positions of the magnetic field sensor 144 in a z-direction (see axes in FIG. 5) as the magnet 146 rotates. To generate the curves 272-290, it is again presumed that the magnet 146 of FIG. 5 has one north pole and one south pole. It is also presumed that the distance 150 of FIG. 5 is about 1 mm. It is also presumed that the magnet 146 has a thickness between the first and second surfaces 146a, 146b of about 3 mm.

The curve 272 is representative of a position of the magnetic field sensor 144 in the z-direction corresponding to zero millimeters, which is equivalent to the magnetic field sensor 144 (i.e., the magnetic field sensing element within the magnetic field sensor 144) being centered upon the y-axis, which is midway between the first and second opposing surfaces 146a, 146b of the magnet 146. At the position represented by the curve 272, errors of the magnetic field sensor 144 are high due to the absence or near absence of a magnetic field in the maximum response direction 145.

The remaining curves 274-290 are representative of positions of the magnetic field sensing element in increments of 0.5 millimeters in the z-direction of FIG. 5. It can be seen that the curve 276 has a lowest angular error of about +/−eight degrees. The curve 276 corresponds to an offset in the z-direction of 1.0 millimeters and corresponds to the curve 246 of FIG. 9.

Referring now to FIG. 11, a graph 300 has a horizontal axis with a scale in units of angular rotation in degrees of a magnet, for example, the magnet 146 of FIG. 5. The graph 300 also includes a vertical axis with a scale in units of estimated angular error in degrees.

Curves 302-312 are representative of angular errors of pointing directions of sensed magnetic fields versus rotation angle of the magnet 146 at a variety of positions of the magnetic field sensor 144 of FIG. 5, specifically for different positions of the magnetic field sensor 144 in a y-direction (see axes in FIG. 5) as the magnet 146 rotates. To generate the curves 302-312, it is again presumed that the magnet 146 of FIG. 5 has one north pole and one south pole. It is also presumed that the magnet 146 has a thickness between the first and second surfaces 146a, 146b of about 3 mm.

The curve 302 is representative of a position of the magnetic field sensor 144 (i.e., the magnetic field sensing element within the magnetic field sensor 144) in the y-direction corresponding to zero millimeters, and shifted 1.5 mm along the z-axis from the center position between the first and second opposing surfaces 146a, 146b of the magnet 146. The curves 302-312 are generated for the z-direction position of the magnetic field sensor 144 of 1.5 millimeters, corresponding to positions of the magnetic field sensor 144 to generate the curve 248 of FIG. 9 and curve 278 of FIG. 10.

The remaining curves 304-312 are representative of positions of the magnetic field sensing element in increments of 0.5 millimeters in the y-direction of FIG. 5. It can be seen that the curves 214-222 do not have equivalent errors. Thus, it should be appreciated that movement or placement error of the magnetic field sensor 144 in the direction of the y-axis (i.e., changes of air gap) does affect the accuracy of the sensed magnetic field.

By comparison of FIGS. 6-8 with FIGS. 9-11, it can be seen that the magnetic field sensor arrangement 140 of FIG. 5 can achieve similar or better accuracies than the magnetic field sensor arrangement 120 of FIG. 4.

Figure 12:
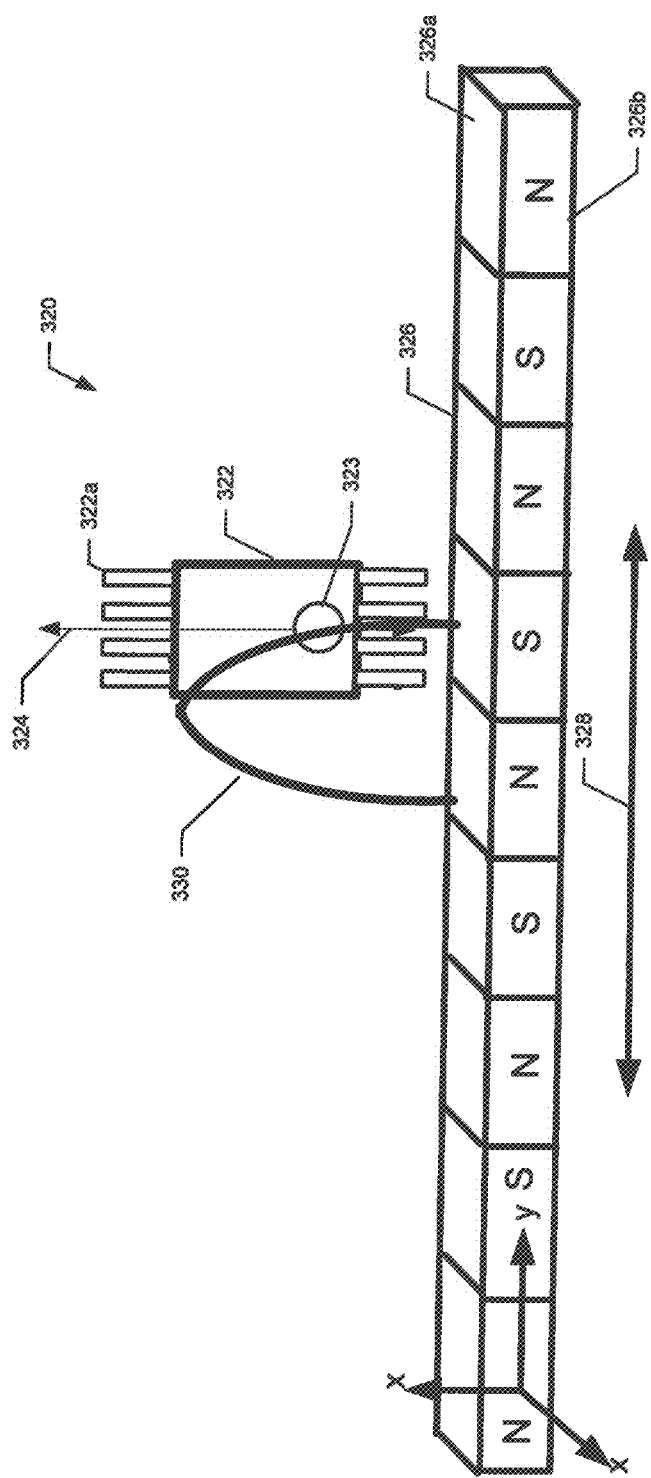
FIG. 12 is a pictorial of another magnetic field sensor arrangement having a magnetic field sensor proximate to line magnet configured to move linearly.

Referring now to FIG. 12, a magnetic field sensor arrangement 320 includes a magnet 326 having two opposing surfaces 326a, 326b separated by a magnet thickness. The magnet 326 has at least one north pole and at least one south pole, but can have a plurality of north poles and/or a plurality of south poles as shown.

The magnet 326 can be coupled to a target object (not shown).

A magnetic field sensor 322 has a magnetic field sensing element (e.g., a CVH sensing element 323) with a center and with at least one major response axis 324 disposed in a major response plane (e.g., parallel to a y-z plane) intersecting the magnetic field sensing element 323. The magnetic field sensor 324 is disposed proximate to the magnet 326 with the major response plane within forty-five degrees of perpendicular to an x-y plane. In some embodiments, the major response plane is perpendicular to the x-y plane.

In some embodiments as shown, a center of the magnetic field sensing element (e.g., 323) is disposed in a plane parallel to and not between the two opposing surfaces 326a, 326b. However, in other embodiments, the center of the magnetic field sensing element is disposed in a plane between the two opposing surfaces 326a, 322b.

Magnetic field lines, of which a magnetic field line 330 is but one example, take a variety of paths from a north pole to the south pole. The magnetic field sensor 322 is responsive to the magnetic field, e.g., 330, generated by the magnet 326.

It will be recognized that the magnetic field sensor 322 can be disposed at a position such that magnetic field lines, e.g., the magnetic field line 330, passes through the magnetic field sensor 322, and, in particular, through the magnetic field sensing element within the magnetic field sensor 322, in a direction generally parallel to the major response axis 324.

With the magnetic field sensor arrangement 320, a linear position of the magnet 326, configured to move in directions 328, can be sensed by the magnetic field sensor 322.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor arrangement comprising:
a magnet having two opposing major surfaces, the two opposing major surfaces disposed parallel to an x-y plane of x-y-z Cartesian coordinates, the two opposing major surfaces separated by a magnet thickness, a line parallel to the x-y plane and bisecting one of the two opposing major surfaces, the one of the two opposing major surfaces having at least one north magnetization on one side of the bisecting line and having at least one south magnetization on the other side of the bisecting line; and
a magnetic field sensor comprising a magnetic field sensing element with a center and with at least one major response axis disposed in a major response plane intersecting the magnetic field sensing element, wherein the magnetic field sensor is disposed proximate to the magnet with the major response plane within forty-five degrees of perpendicular to the x-y plane and with the major response axis within forty-five degrees of perpendicular to the x-y plane;
wherein the magnetic field sensing element of the magnetic field sensor is disposed a first distance in a y direction from an edge of the magnet and a second distance in a z direction from the edge of the magnet, and wherein the first and second distances are selected to reduce an angular error of pointing directions of sensed magnetic fields versus a rotational angle of the magnet.

2. The magnetic field sensor arrangement of claim 1, wherein the center of the magnetic field sensing element is disposed in a plane parallel to the x-y plane and between the two opposing major surfaces of the magnet.

3. The magnetic field sensor arrangement of claim 1, wherein the center of the magnetic field sensing element is disposed in a plane parallel to the x-y plane and not between the two opposing major surfaces of the magnet.

4. The magnetic field sensor arrangement of claim 1, wherein the magnetic field sensing element comprises a circular vertical Hall (CVH) sensing element.

5. The magnetic field sensor arrangement of claim 1, wherein the magnetic field sensing element comprises a magnetoresistance element or a vertical Hall element.

6. The magnetic field sensor arrangement of claim 1, wherein the magnetic field sensor is disposed proximate to the magnet with the major response plane perpendicular to the x-y plane.

7. The magnetic field sensor arrangement of claim 1, wherein the magnet comprises a ring magnet.

8. The magnetic field sensor arrangement of claim 7, wherein the ring magnet comprises a plurality of north poles and a plurality of south poles.

9. The magnetic field sensor arrangement of claim 1, wherein the magnet comprises a line magnet.

10. The magnetic field sensor arrangement of claim 9, wherein the line magnet comprises a plurality of north poles and a plurality of south poles.

11. A method of sensing a movement of an object, comprising:
attaching to the object a magnet having two opposing major surfaces, the two opposing major surfaces disposed parallel to an x-y plane of x-y-z Cartesian coordinates, the two opposing major surfaces separated by a magnet thickness, a line parallel to the x-y plane and bisecting one of the two opposing major surfaces, the one of the two opposing major surfaces and having at least one north magnetization on one side of the bisecting line at least one south magnetization on the other side of the bisecting line; and
placing, proximate to the magnet, a magnetic field sensor comprising a magnetic field sensing element with a center and with at least one major response axis disposed in a major response plane intersecting the magnetic field sensing element, wherein the magnetic field sensor is disposed with the major response plane within forty-five degrees of perpendicular to the x-y plane and with the major response axis within forty-five degrees of perpendicular to the x-y plane;
wherein the magnetic field sensing element of the magnetic field sensor is disposed a first distance in a y direction from an edge of the magnet and a second distance in a z direction from the edge of the magnet, and wherein the first and second distances are selected to reduce an angular error of pointing directions of sensed magnetic fields versus a rotational angle of the magnet.

12. The method of claim 11, wherein the center of the magnetic field sensing element is disposed in a plane parallel to and between the two opposing major surfaces of the magnet.

13. The method of claim 11, wherein the center of the magnetic field sensing element is disposed in a plane parallel to and not between the two opposing major surfaces of the magnet.

14. The method of claim 11, wherein the magnetic field sensing element comprising a circular vertical Hall (CVH) sensing element.

15. The method of claim 11, wherein the magnetic field sensing element comprises a magnetoresistance element or a vertical Hall element.

16. The method claim 11, wherein the magnetic field sensor is disposed proximate to the magnet with the major response plane perpendicular to the x-y plane.

17. The method of claim 11, wherein the magnet comprises a ring magnet.

18. The method of claim 17, wherein the ring magnet comprises a plurality of north poles and a plurality of south poles.

19. The method of claim 11, wherein the magnet comprises a line magnet.

20. The method of claim 19, wherein the line magnet comprises a plurality of north poles and a plurality of south poles.

* * * * *

UNITED STATES PATENT AND TRADEMARK OFFICE
CERTIFICATE OF CORRECTION

PATENT NO. : 9,606,190 B2
APPLICATION NO. : 13/724149
DATED : March 28, 2017
INVENTOR(S) : Andreas P. Friedrich et al.

It is certified that error appears in the above-identified patent and that said Letters Patent is hereby corrected as shown below:

In the Specification

Column 1, Line 20, delete "particular ways" and replace with --particular way--

Column 2, Line 35, delete "therefore" and replace with --Therefore,--

Column 4, Line 52, delete "four, of the" and replace with --four of the--

Column 8, Lines 15-16, delete "CVH sensing element 72 when the CVH sensing element 72" and replace with --CVH sensing element 72--

Column 10, Line 18, delete "poses" and replace with --poles--

Column 11, Line 15, delete "poses" and replace with --poles--

Signed and Sealed this
Tenth Day of April, 2018

Andrei Iancu
*Director of the United States Patent and Trademark Office*